United States Patent [19]
Yusuki et al.

[11] Patent Number: 5,309,386
[45] Date of Patent: May 3, 1994

[54] SEMICONDUCTOR MEMORY WITH ENHANCED CAPACITY

[75] Inventors: Tatsushi Yusuki, Nara; Atsushi Miura, Yamatokoriyama; Kenichi Tanaka, Nara, all of Japan

[73] Assignee: Sharp Kabushiki Kaisha, Osaka, Japan

[21] Appl. No.: 699,348

[22] Filed: May 13, 1991

[30] Foreign Application Priority Data

May 14, 1990 [JP] Japan ............................. 2-123583
May 18, 1990 [JP] Japan ............................. 2-129706

[51] Int. Cl.⁵ ........................ G11C 5/02; G11C 11/24
[52] U.S. Cl. .................................... 365/51; 365/149; 257/308; 257/309
[58] Field of Search ............... 257/308, 309; 365/51, 365/149

[56] References Cited

U.S. PATENT DOCUMENTS

| | | | |
|---|---|---|---|
| 4,300,212 | 11/1981 | Simko | 365/51 |
| 4,464,734 | 8/1984 | McElroy | 365/51 |
| 4,763,299 | 8/1988 | Hazani | 365/51 |
| 5,140,389 | 8/1992 | Kimura et al. | 257/309 |

Primary Examiner—Rolf Hille
Assistant Examiner—David Ostrowski
Attorney, Agent, or Firm—Nixon & Vanderhye

[57] ABSTRACT

A semiconductor memory wherein a plurality of cells are arranged in a longitudinal direction of active regions, each cell having a node electrode and a contact hole for the node electrode, and a bit line contact region and the active region by half at the least on a semiconductor substrate having the active regions and word lines which are extended in a direction perpendicular to the longitudinal direction of the active regions, the bit line contact regions of adjacent bit lines are shifted by a quarter in the longitudinal direction between the adjacent cells in a direction in which the word lines are extended, and the projected shape of the node electrode is a polygon having more angles than a quadrangle which is substantially adapted as the node electrode and having at least one of interior angles set to be obtuse so that the projected area is substantially larger than that of the quadrangle.

9 Claims, 14 Drawing Sheets

SEMICONDUCTOR MEMORY WITH ENHANCED CAPACITY

BACKGROUND OF THE INVENTION

1. Field of the Invention

The present invention relates to a semiconductor memory, and more particularly to a MOS dynamic memory comprising a stacked memory capacitor.

2. Description of the Prior Art

To ensure cell capacity with high integration of an LSI memory, there has been developed and put to practical use a stacked memory capacitor in which the surface level difference among the lower layers of a semiconductor device is utilized on a three-dimensional basis.

Figure 22:
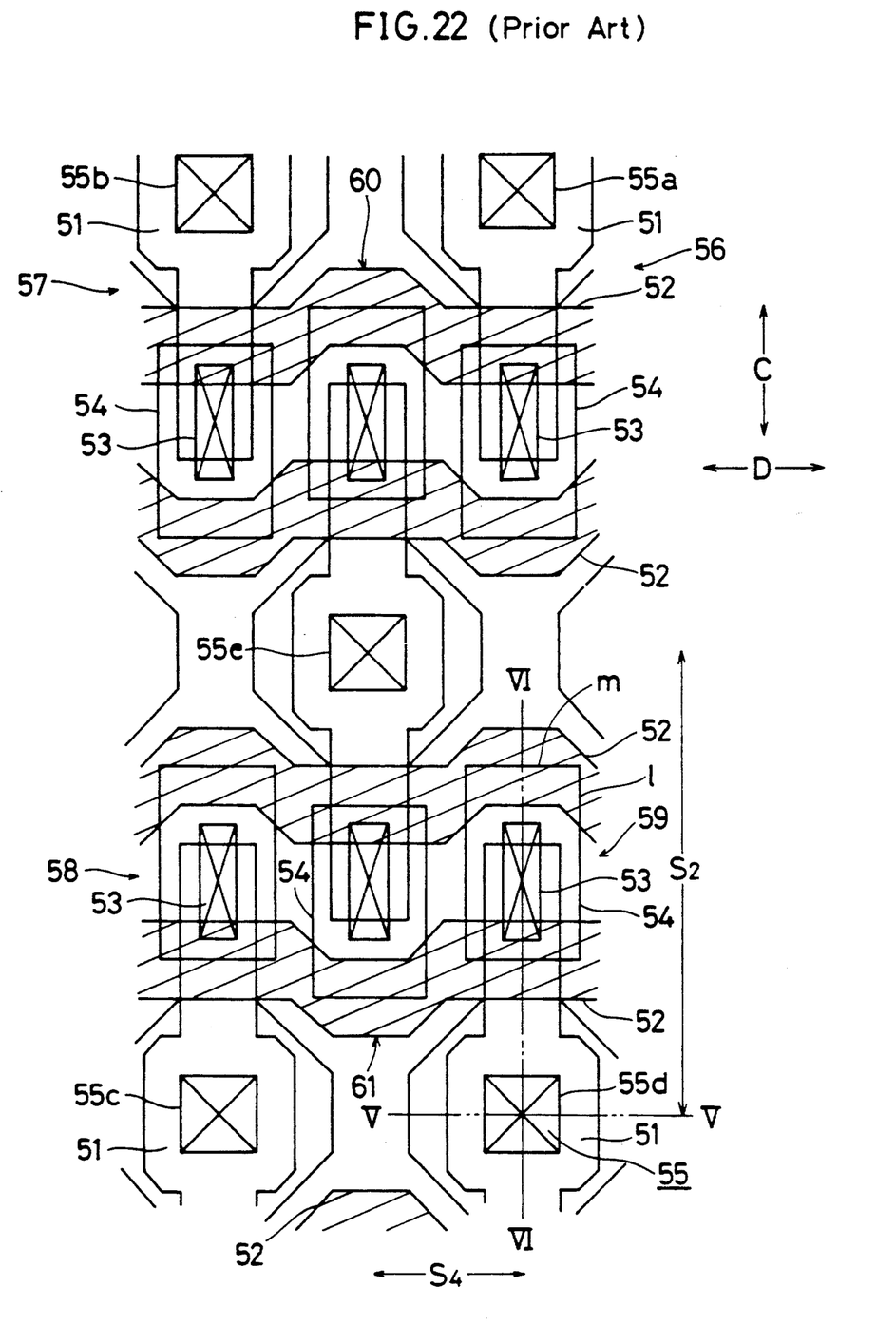
FIG. 22 is a view showing the entire structure of the conventional example.

FIG. 22 shows the layout of the stacked capacitor in the folded bit line form. In FIG. 22, the stacked capacitor has a plurality of cells 56 to 61 arranged in a direction of an arrows C and D. Each cell has a contact 53 for a node electrode and a node electrode 54, and a bit line contact region 55a, 55b, 55c, 55d or 55e and an active region 51 by half at the least on a semiconductor substrate. The semiconductor substrate has the active regions 51 and word lines (transfer gates) 52. The word lines 52 are extended in a direction (a direction of an arrow D) perpendicular to a longitudinal direction of the active regions 51 (the C direction).

The adjacent bit line contact regions 55a and 55b are arranged on the same line parallel with the D direction between the cells 56 and 57. In addition, the adjacent bit line contact regions 55c and 55d are arranged on the same line parallel with the D direction between the cells 58 and 59.

Furthermore, the projected shape of the node electrode 54 is a quadrangle which is adapted as a node electrode.

Each cell has a size $S_2$ of 6 μm in the C direction, and a size $S_4$ of 2 μm in the D direction.

Figure 23:
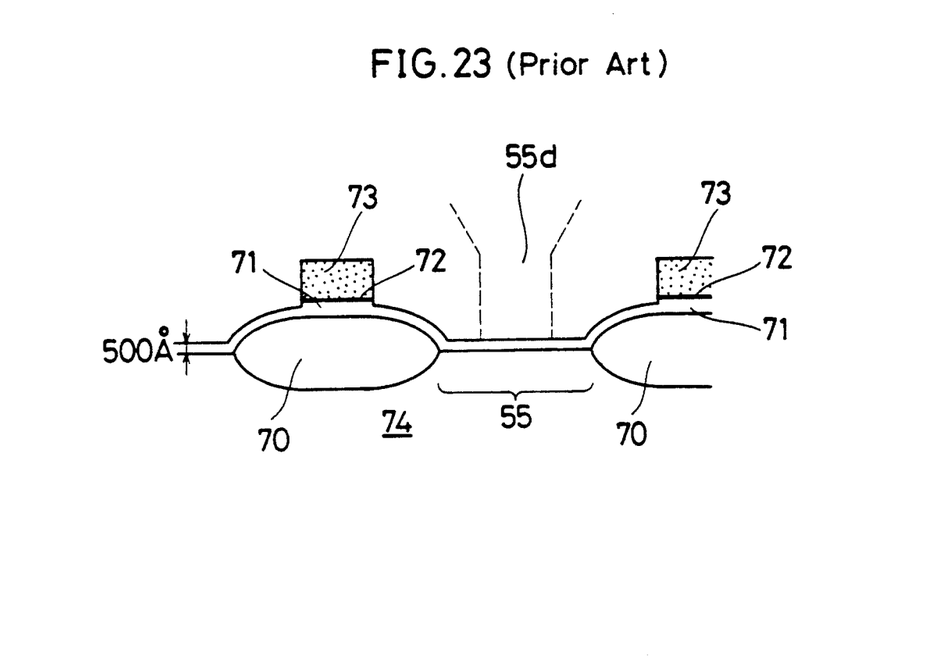
FIG. 23 is a view seen in a direction of V—V in FIG. 22.
Figure 24:
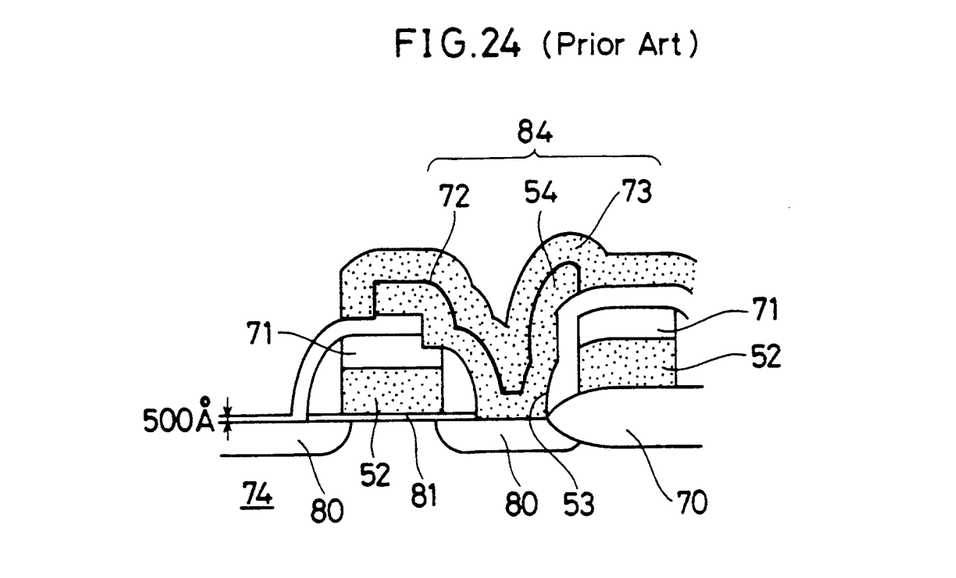
FIG. 24 is a view seen in a direction of VI—VI in FIG. 22.

As shown in FIGS. 23 and 24, the bit line contact region 55 includes a bit line contact hole 55d. The bit line contact hole 55d is formed between LOCOS films 70, 70 on a Si substrate 74 having the LOCOS films 70, $SiO_2$ films 71, capacitor insulating films 72 and a plate electrodes 73. The contact hole 53 for the node electrode is formed between the transfer gate 52 which is provided on the LOCOS film 70 and the transfer gate 52 which is provided through a gate oxide film 81 on the Si substrate 74 having impurity diffusion layers 80, 80. The contact hole 53 is buried by a capacitor 84 comprised of the node electrode 54, the capacitor insulating film 72 and the plate electrode 73.

Referring to the memory in the folded bit line form, a short side m of the node electrode 54 is always set to the minimum dimension between the node electrodes 54, 54 which is defined by design rules. For this reason, the maximum projected area of the node electrode 54 is automatically determined by overlapping with each layer.

Referring to the cell layout mentioned above, however, the projected area of the node electrode is determined by overlapping with each layer. Consequently, when the cell size is specified, the cell capacity is determined.

Accordingly, the cell size is reduced with the high integration of the LSI memory. Consequently, it becomes more difficult to ensure the cell capacity.

SUMMARY OF THE INVENTION

The present invention provides a semiconductor memory wherein a plurality of cells are arranged in a longitudinal direction of active regions, each cell having a node electrode and a contact hole for the node electrode, and a bit line contact region and the active region by half at the least on a semiconductor substrate having the active regions and word lines which are extended in a direction perpendicular to the longitudinal direction of the active regions, the bit line contact regions of adjacent bit lines are shifted by a quarter in the longitudinal direction between the adjacent cells in a direction in which the word lines are extended, and the projected shape of the node electrode is a polygon having more angles than a quadrangle which is substantially adapted as the node electrode and having at least one of interior angles set to be obtuse so that the projected area is substantially larger than that of the quadrangle.

From another aspect, the present invention further provides a semiconductor memory wherein the layout of the plate electrode does not exist between the adjacent bit line contact regions.

DETAILED DESCRIPTION OF A PREFERRED EMBODIMENT

The present invention is characterized in that the projected shape of a node electrode is a polygon whose projected area is substantially larger than that of a quadrangle, bit line contact regions are arranged on a diagonal line, and the layout of a plate electrode does not exist between the adjacent bit line contact regions.

According to the present invention, bit line contacts of adjacent bit lines are shifted by a quarter of a cell length in a longitudinal direction of active regions so as to be mutually arranged in a direction in which word lines are extended. In addition, the node electrode of each cell has the projected shape of the polygon which has more angles than the quadrangle and in which at least one of interior angles is obtuse. Consequently, it is possible to ensure cell capacity which is larger than that of the folded bit line form for the same cell size.

The node electrode of the present invention is the polygon whose projected area is substantially larger than that of the quadrangle. The projected shape of a conventional node electrode 54 shown in FIG. 22 is compared with that of a hexagonal node electrode 4 according to the present embodiment shown in FIG. 1. The projected shape of the conventional node electrode 54 is a rectangle of which long side l is extended in a direction of an arrow C. The hexagonal node electrode 4 has a long side l which is equal to that of the rectangle, a short side m which is equal to that of the rectangle and is perpendicular to the long side l, and four other sides. Interior angles $\alpha$ and $\beta$, which are formed by the four other sides, are set to obtuse ones. Consequently, a hexagon has the area which is larger than that of the rectangle shown in FIG. 22 by about 9%.

Figure 17:
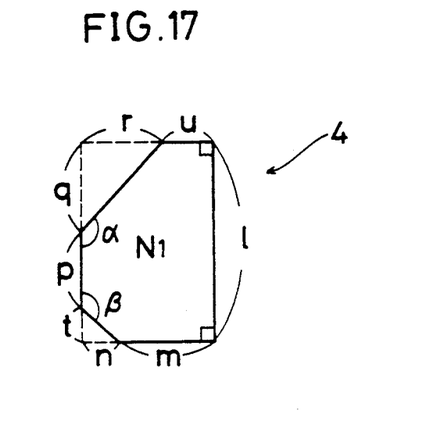
FIG. 17 is a view showing a node electrode according to the embodiment.

More specifically, the projected area of the hexagonal node electrode 4 of the present embodiment shown in FIG. 17 is compared with that of the conventional rectangular node electrode 54 shown in FIG. 21 as follows.

In FIG. 17, l=2.5 μm, m=1.5 μm, n=t=0.5 μm, p=0.75 μm, q=r=1.25 μm, u=0.75 μm, and $\alpha = \beta = 135°$.

Accordingly, the projected area $N_1$ of the node electrode 4 can be obtained by the following formula.

$$\begin{aligned} N_1 &= 2.5 \times 2.0 - (0.5 \times 0.5 + 1.25 \times 1.25) \times 1/2 \\ &= 5 - 0.90625 \\ &= 4.09375 \, (\mu m)^2 \end{aligned}$$

Figure 21:
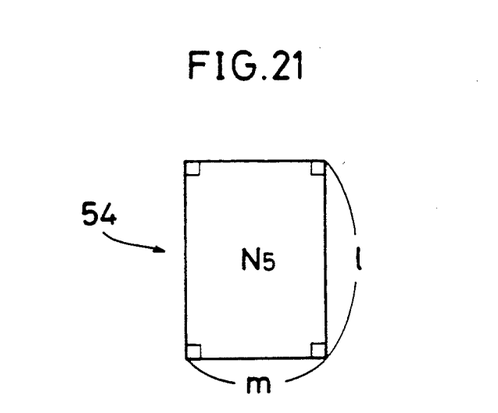
FIG. 21 is a view showing the node electrode according to the conventional example.

In FIG. 21, l=2.5 μm and m=1.5 μm. Accordingly, the projected area $N_5$ of the conventional node electrode can be obtained as follows.

$$\begin{aligned} N_5 &= 2.5 \times 1.5 \\ &= 3.75 \, (\mu m)^2 \end{aligned}$$

As described above, $N_1$ is greater than $N_5$. In addition, the projected area can be increased by about 9%. Consequently, even if the cell size is reduced with high integration of an LSI memory, it is possible to ensure the larger cell capacity according to the present invention.

Figure 18:
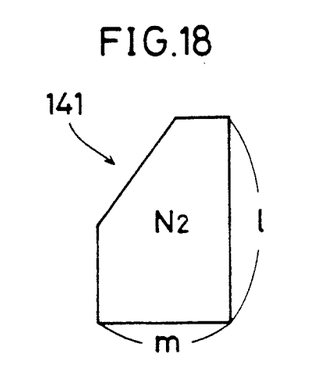
FIGS. 18 to 20 are views showing variants of the node electrode according to the present invention.
Figure 19:
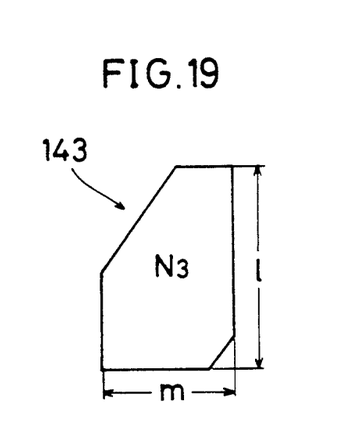
Figure 20:
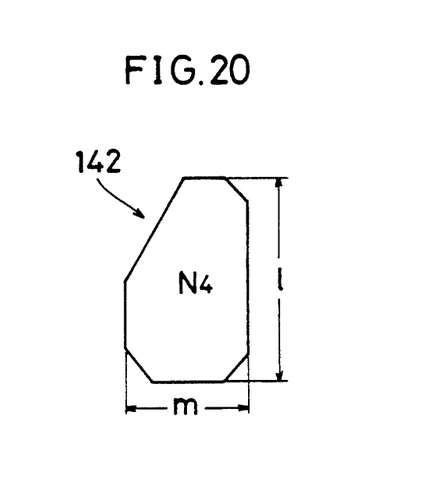

Furthermore, the projected shape of the node electrode according to the present invention is not limited to a hexagon. It is desired that the projected area can be increased. By way of example, there can be used a pentagon (141) having the projected area of $N_2$ (see FIG. 18), an octagon (142) having the projected area of $N_4$ (see FIG. 20), a hexagon (143) of which shape is different from that of the above-mentioned hexagon and which has the projected area of $N_3$, and a heptagon. In other words, there can be used a polygon having more angles than a quadrangle.

Figure 1:
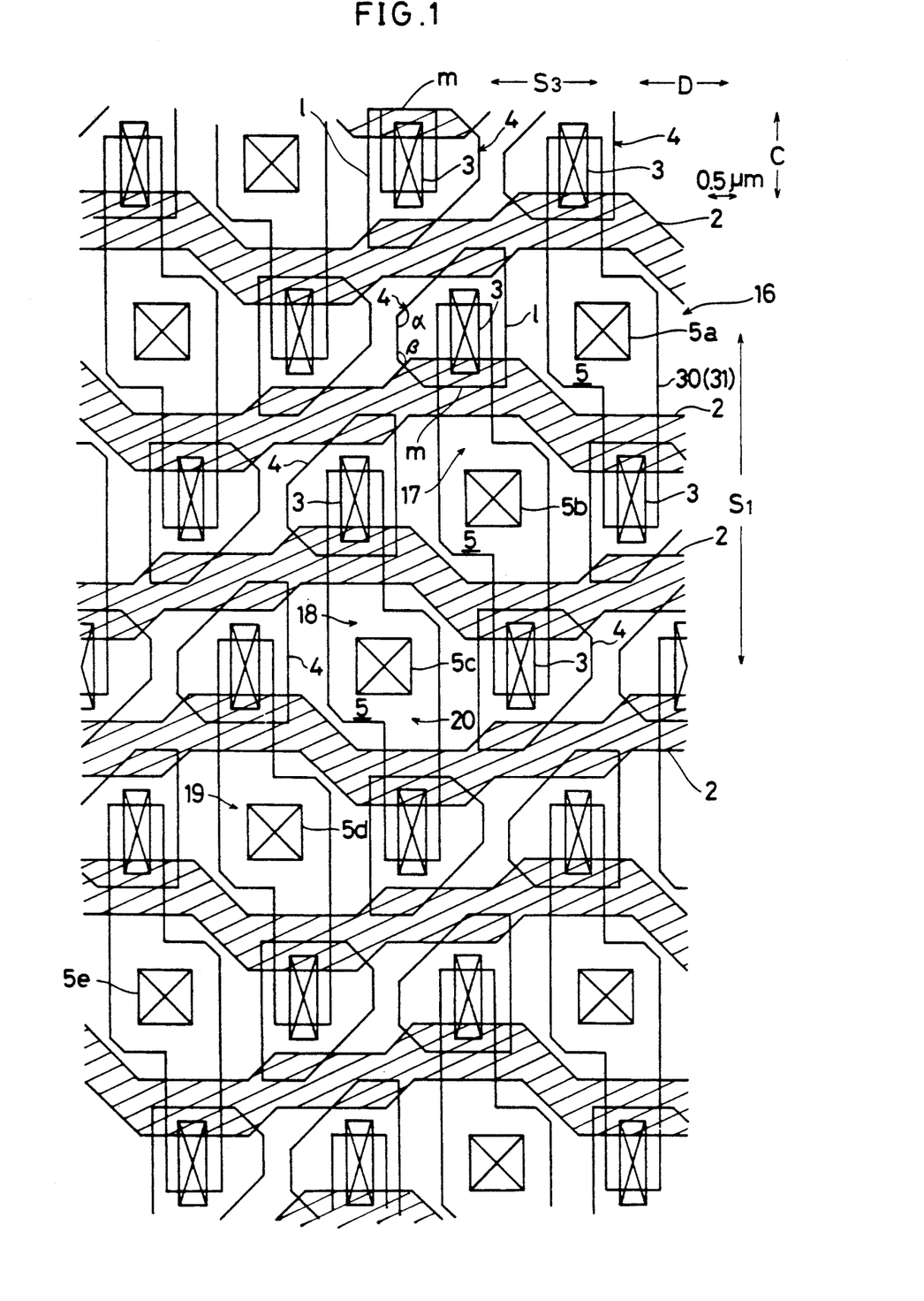
FIG. 1 is a view showing the entire structure of one embodiment of the present invention.

According to the present invention, there are provided cells in which bit line contact holes (5a) to (5e) are arranged on a diagonal line and which have a size S, of 6 μm in the C direction and a size $S_3$ of 2 μm in a direction of an arrow D as shown in FIG. 1. In the cells, the plate electrode is removed so as not to exist among the bit line contact regions.

Figure 3:
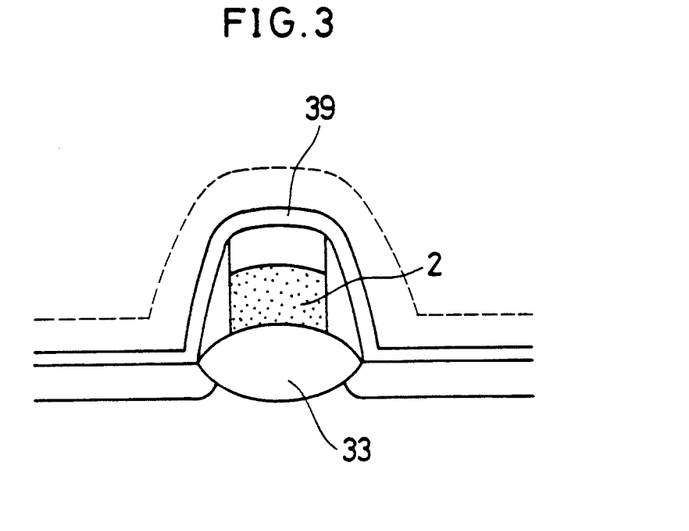
FIG. 3 is a view shown in a direction of III—III in FIG. 2.
Figure 4:
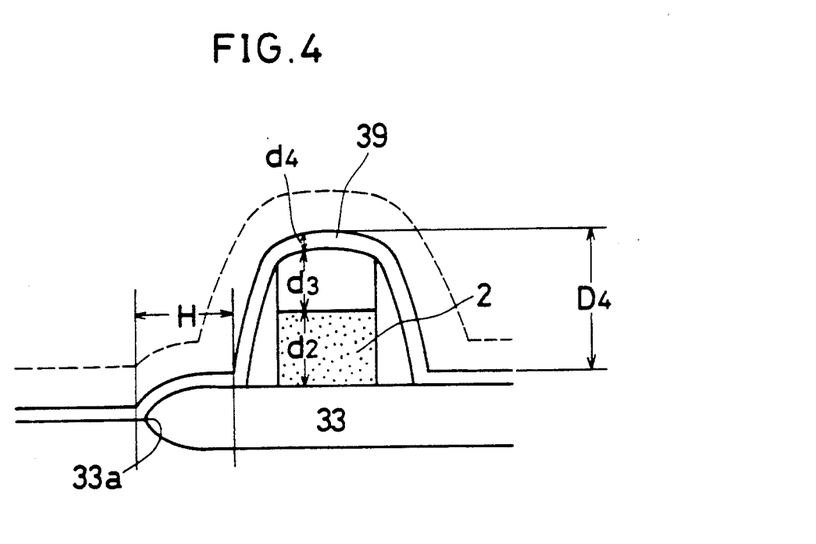
FIG. 4 is a view shown in a direction of IV—IV in FIG. 2.

The foregoing will be described in more detail with reference to FIGS. 1 and 2, in particular to FIGS. 3 and 4. FIG. 3 is a view seen in a direction of III—III in FIG. 2. FIG. 4 is a view seen in a direction of IV—IV in FIG. 2 (i.e., a view seen in a diagonal direction which is slightly shifted from FIG. 3).

In this case, the advantages of the present embodiment will be described with reference to FIGS. 5 to 8 as comparative examples. FIG. 7 shows a memory in which bit line contact holes (5a) to (5c) are arranged on a diagonal line.

Figure 5:
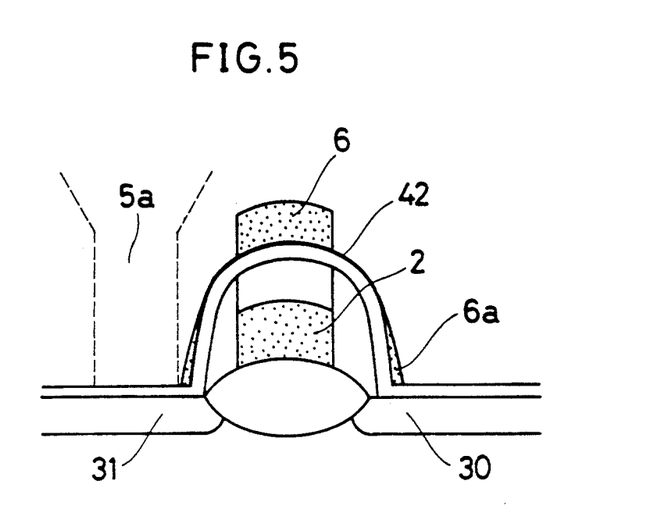
FIG. 5 is a view showing the defects in a example.
Figure 6:
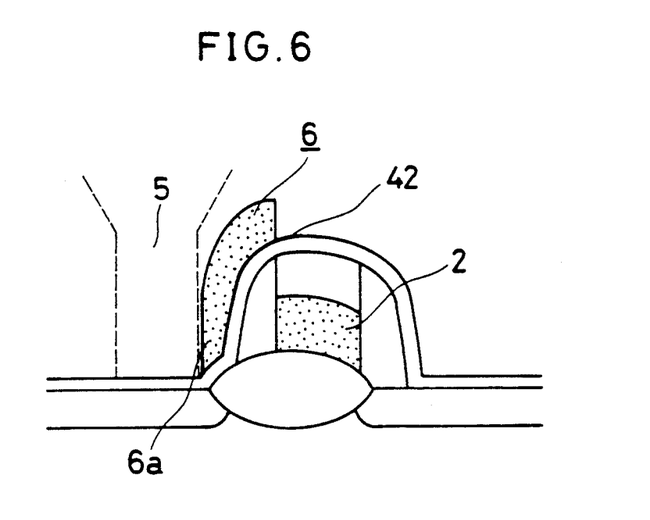
FIG. 6 is a view showing the defects in the example.
Figure 7:
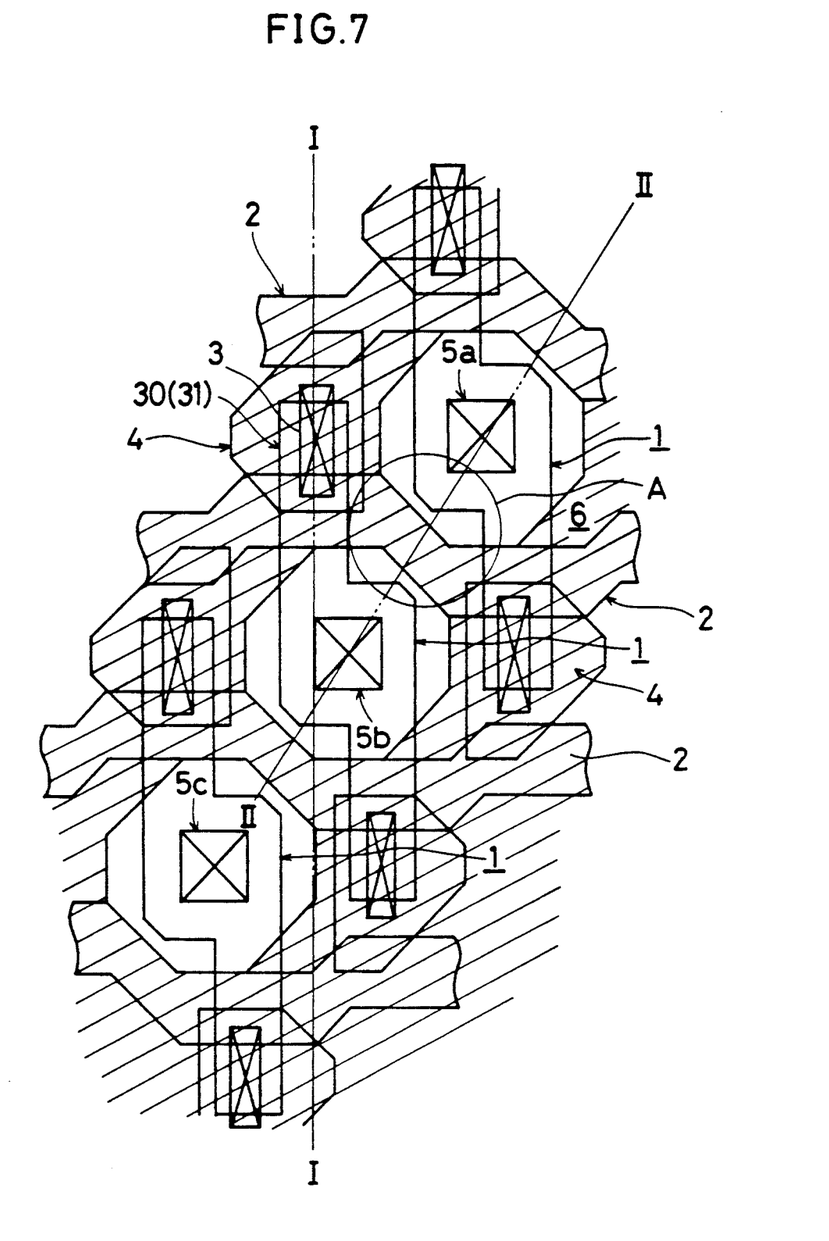
FIG. 7 is a view showing the structure of a main portion in the example.
Figure 8:
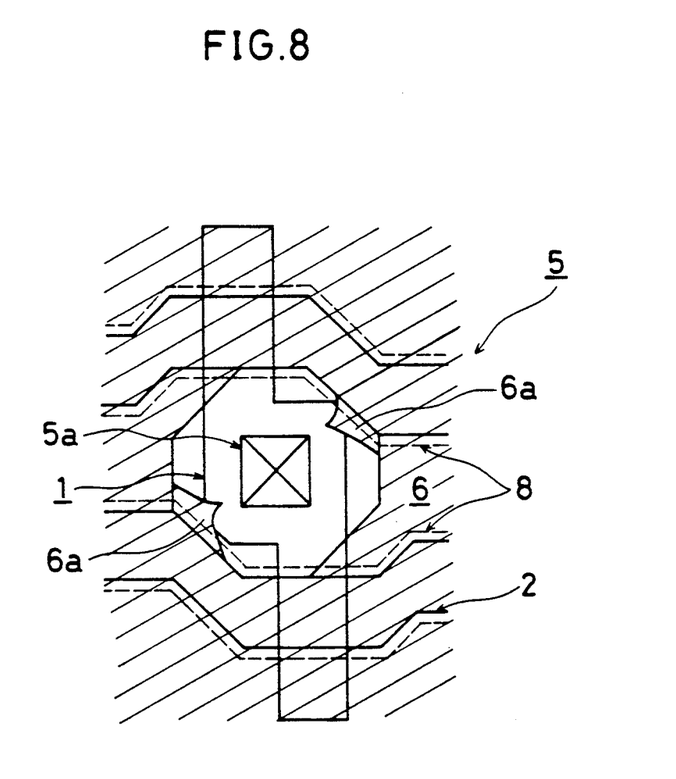
FIG. 8 is a view showing the main portion of the defects in the example.

FIGS. 5 and 6 are views seen in a direction of II—II in FIG. 7. FIG. 8 is an enlarged view showing a main portion of FIG. 7.

There will generally be described a memory, in which the bit line contact regions are arranged on the diagonal line, with reference to FIG. 7 as the comparative example.

The memory will be described with reference to FIGS. 9 to 16. FIGS. 9 to 12 are views seen in a direction of I—I in FIG. 7. FIGS. 13 to 16 are views seen in a direction of II—II in FIG. 7.

Figure 9:
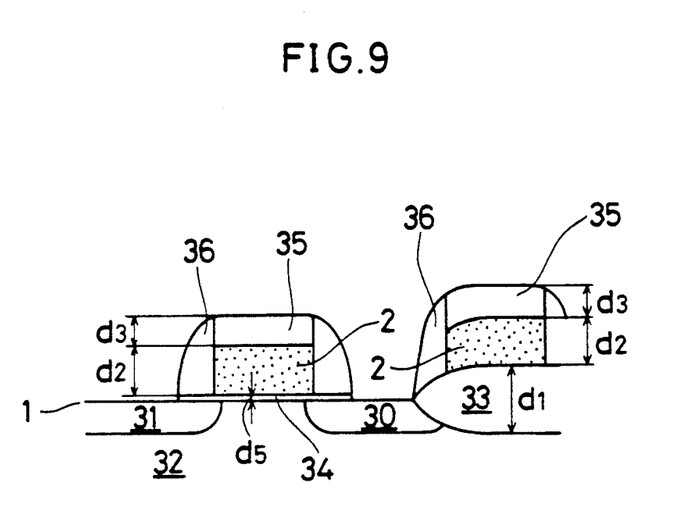
FIGS. 9 to 12 are views showing a manufacturing method in the conventional example and seen in a direction of I—I in FIG. 7.

As shown in FIG. 9, a LOCOS film (33) as an element separation film is formed on a P-type Si substrate (32). The LOCOS film (33) has a thickness $d_1$ of 4000 Å. Then, thermal oxidation is performed to form a gate oxide film (34) having a thickness $d_5$ of 150 Å. A polysilicon layer having a thickness $d_2$ of 3000 Å is laminated on the gate oxide film (34). Impurities (phosphorus ions) are diffused over the polysilicon layer. Thereafter, a SiO$_2$ film having a thickness $d_3$ of 2000 Å is laminated on the impurities by a CVD method. A transfer gate (2) and a SiO$_2$ film (35) are formed by photoetching technique (see FIG. 13). Ions are injected over the entire surface of the Si substrate (32) including the transfer gate (2) so as to form a source (30) and a drain (31). Furthermore, a SiO$_2$ film is laminated at a thickness of 2500 Å by the CVD method. The laminated SiO$_2$ film is etched back by reactive ion etching technique so as to form a side wall (36).

Figure 10:
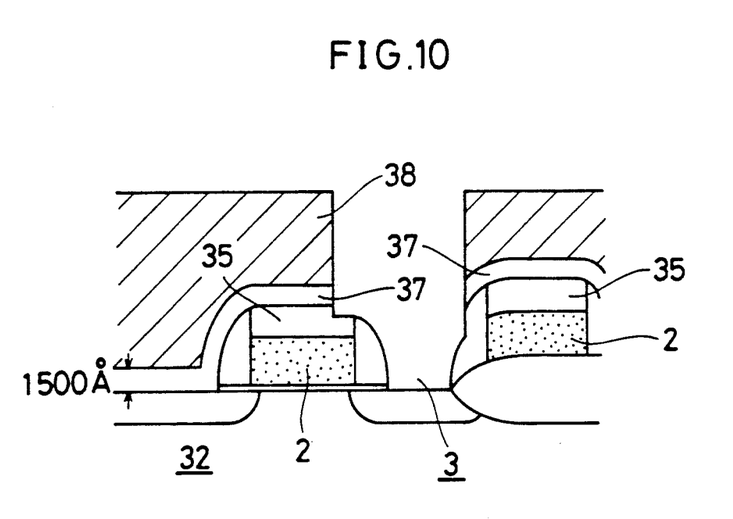

Then, a SiO$_2$ film (37) is laminated at a thickness of 1500 Å by the CVD method as shown in FIG. 10. Thereafter, a resist film (38) (see FIG. 14) is used to form a contact hole (3) for the node electrode by the photoetching technique.

Figure 11:
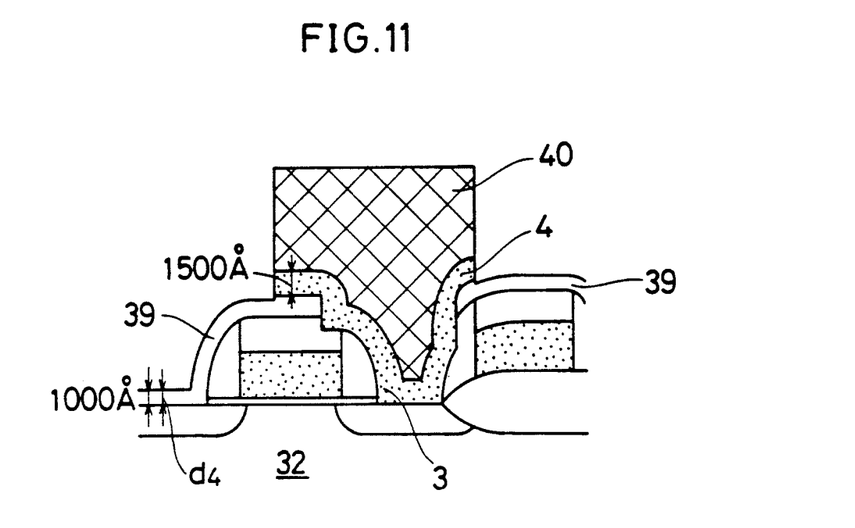

Subsequently, a polysilicon layer is laminated at a thickness of 1500 Å on the Si substrate including the contact hole (3) for the node electrode by the CVD method as shown in FIG. 11. The impurities (phosphorus ions) are diffused over the polysilicon layer. Then, a resist film (40) is used to form a node electrode (4) by the photoetching technique.

Figure 15:
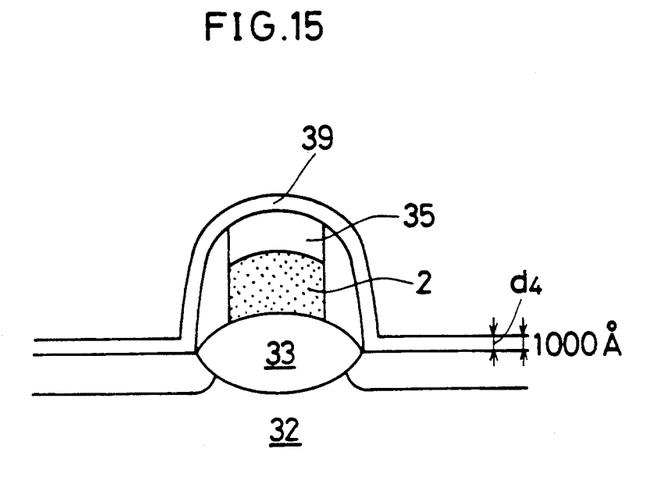

In this case, the SiO$_2$ film (37) (see FIG. 14) having a thickness of 1500 Å, which is not covered by the resist film (40), is etched such that a SiO$_2$ film (39) having a thickness $d_4$ of 1000 Å remains (see FIG. 15).

Figure 12:
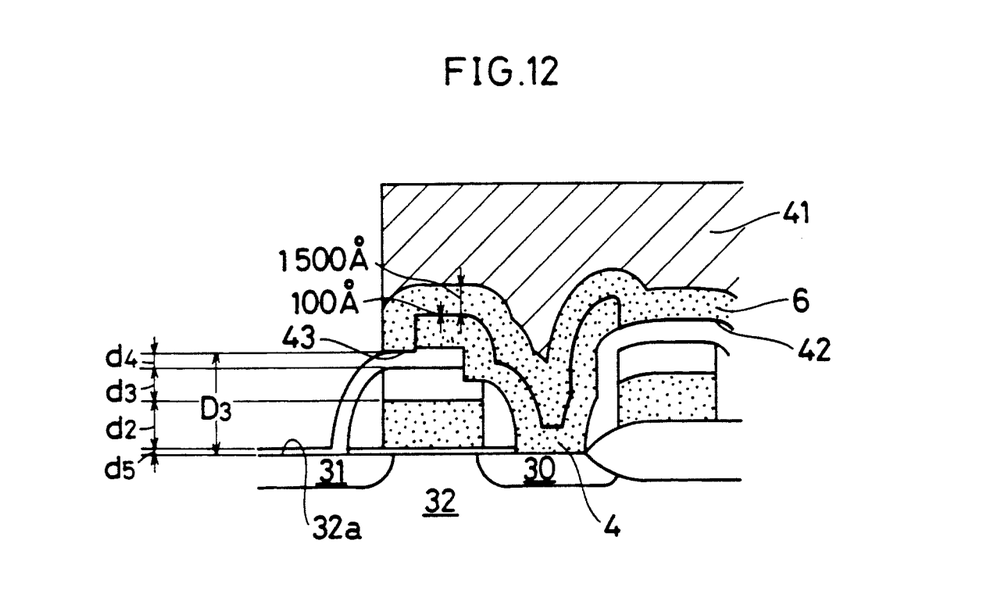
Figure 13:
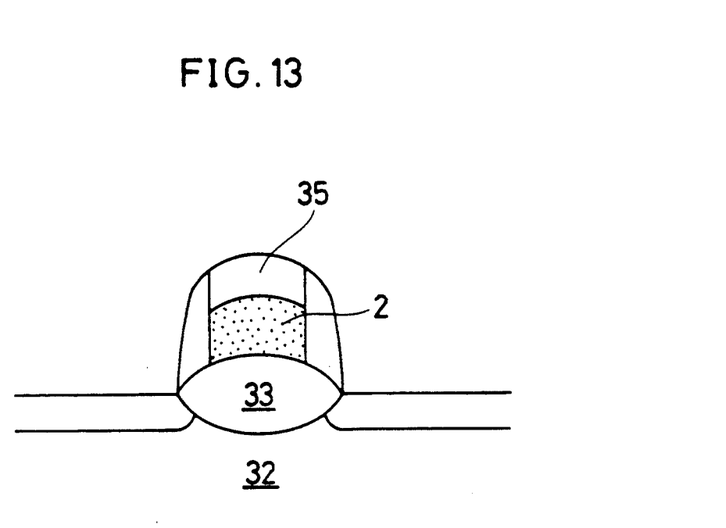
FIGS. 13 to 16 are views showing the manufacturing method in the conventional example and seen in a direction of II—II in FIG. 7.
Figure 14:
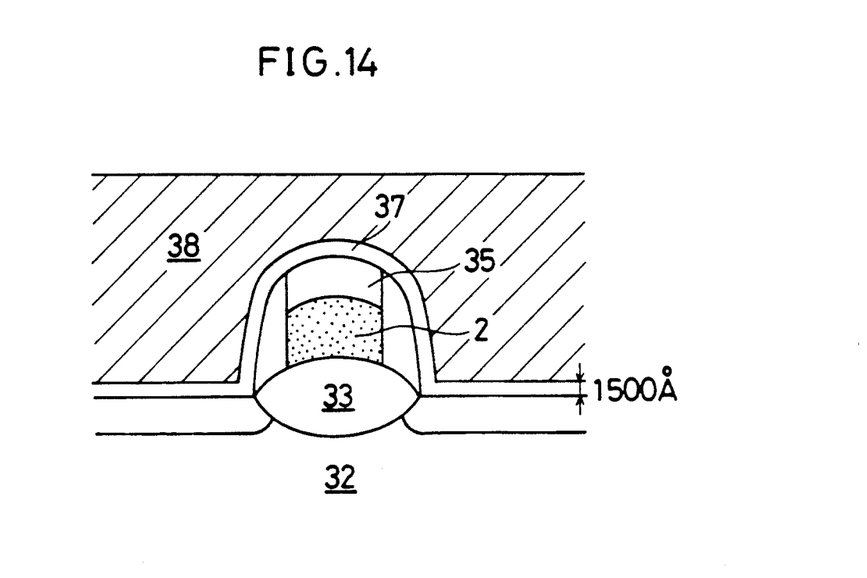

Lastly, a SiO$_2$ film having a thickness of 100 Å and a polysilicon film having a thickness of 1500 Å are sequentially laminated by the CVD method as shown in FIG. 12. Then, the impurities (phosphorus ions) are diffused over the polysilicon film. Thereafter, a resist pattern (41) for forming a plate electrode is used to form a plate electrode (6) and a capacitor insulating film (42) by the photoetching technique (see FIG. 16). Consequently, a memory having capacitor electrodes can be fabricated.

Referring to FIG. 12, there can be obtained a level difference $D_3$ from a surface (32a) of active regions (30) and (31) on the Si substrate (32) to a lower face (43) of the capacitor electrode by the following formula.

$$\begin{aligned} D_3 &= d_5 + d_2 + d_3 + d_4 \\ &= 150 + 3000 + 2000 + 1000 \\ &= 6150 \, (\text{Å}) \end{aligned}$$

Figure 16:
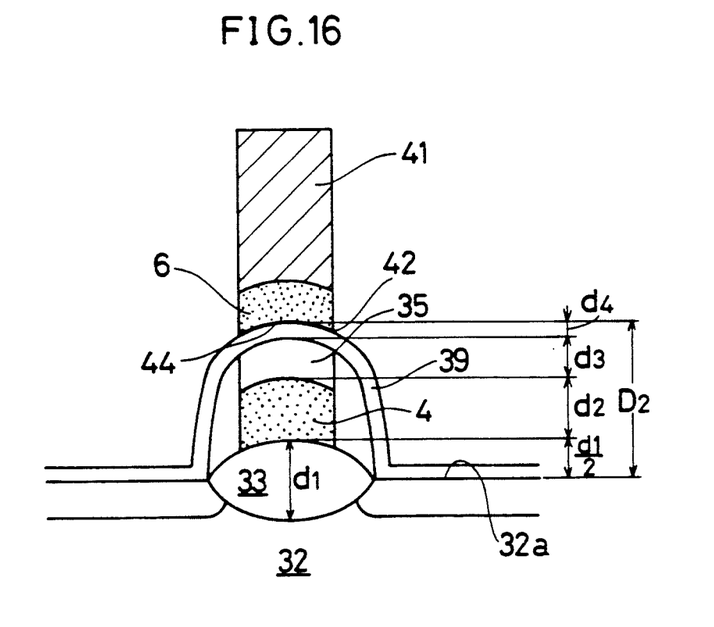

Referring to FIG. 16, there can be obtained a level difference $D_2$ from the surface (32a) of the active regions to a lower face (44) of the capacitor electrode by the following formula.

$$\begin{aligned} D_2 &= d_1/2 + d_2 + d_3 + d_4 \\ &= 2000 + 3000 + 2000 + 1000 \\ &= 8000 \, (\text{Å}) \end{aligned}$$

Referring to FIG. 7 as the comparative example, the II—II portion has the level difference $D_2$. The level difference $D_2$ is larger than the level difference $D_3$ of the I—I portion by $\Delta D$ (about 1850 Å) which is about half the thickness $d_1$ of the LOCOS film (33). Accordingly, in the case where the plate electrode (6) is to be formed by the resist pattern (41) in FIGS. 12 and 16, it is necessary to perform excessive etching by the increase of the level difference, i.e., $\Delta D$ ($= D_2 - D_3$).

With the memory having the structure shown in FIG. 7, it is difficult to obtain the shape shown in FIG. 16. When the polysilicon layer having a thickness of 1500 Å is etched by the resist pattern (41), unetched polysilicon remains in the active regions (30) and (31) as shown in FIGS. 5, 6 and 8.

FIG. 5 shows the case where unetched polysilicon (6a) is generated in the active regions (30) and (31), and the bit line contact (5a) comes into contact with the unetched polysilicon (6a) owing to alignment shift (see FIG. 8). Consequently, the plate electrode (6) and bit line contact (5a) may be short-circuited.

FIG. 6 shows the worst case where the unetched polysilicon (6a) is generated owing to the alignment shift of the transfer gate (2) and plate electrode (6) so that the plate electrode (6) and bit line contact (5a) are short-circuited.

Figure 2:
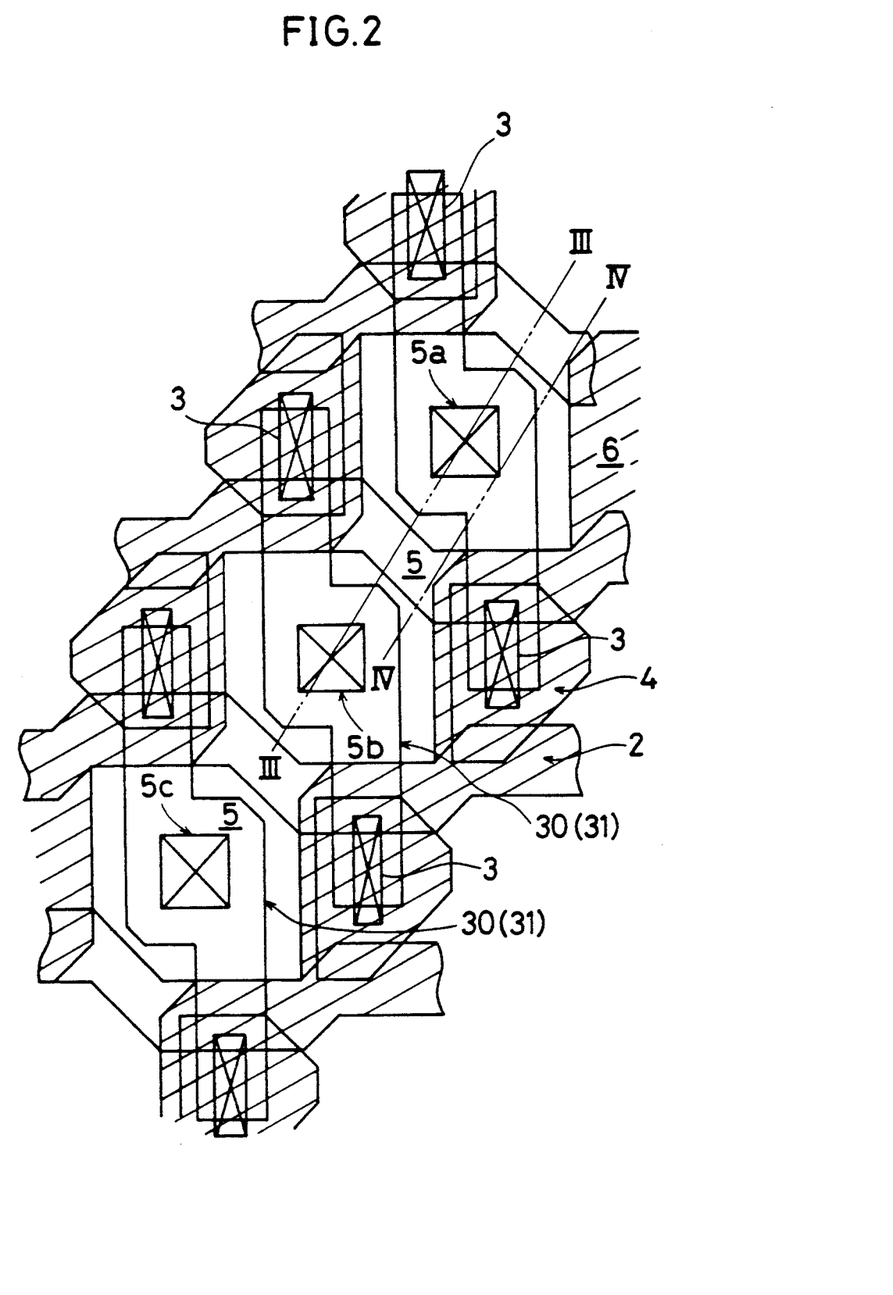
FIG. 2 is a view showing the structure of a main portion of the embodiment.

To avoid the above-mentioned drawbacks, the resist pattern has the configuration in which the plate electrode (6) is not formed in an oblique direction of the bit line contacts (5a) to (5c) (i.e., in a direction of III—III or IV—IV in FIG. 2) as shown in FIGS. 1 and 2.

Referring to FIG. 16, in the case where the periphery of the bit line contact regions (5a) to (5d) is to be removed, the plate electrode (6) is formed by the resist pattern (41). According to the present invention, there is used a pattern (not shown) having the layout in which the plate electrode does not remain on the SiO$_2$ film (39) as shown in FIGS. 3 and 4. FIG. 3 is a view seen in a direction of III—III in FIG. 2. FIG. 4 is a view seen in a direction of IV—IV which is slightly shifted from FIG. 3.

Referring to FIG. 4, the transfer gate (2) is apart from a LOCOS film end (33a) by a distance H. Consequently, a level difference $D_4$ can be obtained by the following formula.

$$\begin{aligned} D_4 &= d_2 + d_3 + d_4 \\ &= 3000 + 2000 + 1000 \\ &= 6000 \, (\text{Å}) \end{aligned}$$

In other words, $D_4$ is almost equal to $D_3$ in FIG. 12. Consequently, processing can easily be performed. The comparative example shown in FIG. 12 has the same structure as that of a view seen in a direction of V—V in FIG. 22.

An embodiment of the present invention will be described in more detail with reference to the drawings. The present invention is not limited to the embodiment to be described below.

In FIG. 1, the stacked capacitor has a plurality of cells 16 to 20 arranged in a direction of an arrow C. Each cell has a contact 3 for a node electrode and a node electrode 4, and a bit line contact region 5a, 5b, 5c, 5d or 5e and active regions 30 and 31 by half at the least on a semiconductor substrate. The semiconductor substrate has the active regions 30 and 31, and word lines (transfer gates) 2. The word lines 2 are extended in a direction (a direction of an arrow D) perpendicular to a longitudinal direction of the active regions 30 and 31 (the C direction).

Furthermore, the bit line contact regions 5a to 5d of the cells 16 to 19 are mutually shifted by a quarter in the C direction among the adjacent cells in the D direction, for example, between the cells 16 and 17 and between the cells 18 and 19.

In addition, the projected shape of the node electrode 4 is a hexagon. The hexagon has interior angles $\alpha$ and $\beta$ which are obtuse, for example, in the cell 17.

Furthermore, each cell has a size $S_1$ of 6 $\mu$m in the C direction and a size $S_3$ of 2 $\mu$m in the D direction.

The present embodiment employs the above-mentioned structure. Consequently, the hexagonal node electrode of the present embodiment has the projected area which is larger than that of the conventional quadrangle by about 9% for the same cell size (2 $\mu$m × 6 $\mu$m). Accordingly, it is possible to ensure cell capacity which is larger by about 9%.

In the conventional example shown in FIG. 7, the plate electrode layout 6 (see FIG. 2) has the configuration in which the bit line contacts (5a) to (5c) are surrounded over the entire periphery thereof. According to the present embodiment, however, the plate electrode layout 6 does not exist among the bit line contacts (5a) to (5c).

As shown in FIGS. 7 and 8, the unetched polysilicon projects into the active region owing to alignment shift on a high level difference portion in the region 5 among the bit line contacts (5a) to (5d). Consequently, the present embodiment (see FIG. 2) has the following structure in order to prevent the bit line contact 5a and unetched polysilicon from coming into contact with each other and being short-circuited. In other words, the plate electrode layout 6 does not exist among the bit line contacts (5a) to (5d), i.e., is penetrated in an oblique direction.

For this reason, even if the alignment shift occurs caused, the bit line contact and unetched polysilicon can be prevented from coming into contact with each other and being short-circuited. Consequently, yield can be enhanced and high reliability can be obtained.

Thus, it is possible to realize the layout of a memory cell which has good productivity.

According to the present invention, the plate electrode layout is omitted in the oblique direction so that the plate electrode does not exist among the bit line contacts. Consequently, it is possible to eliminate the unetched polysilicon which is generated among the bit line contacts. Thus, the unetched polysilicon can be prevented from coming into contact with the bit line contact. As a result, there can be obtained a device having the higher yield and reliability.

Furthermore, the bit line contacts are respectively arranged by a quarter of the cell and the projected shape of the node electrode is the polygon which has more angles than the quadrangle. Consequently, it is possible to ensure the cell capacity which is larger than that of the folded bit line form for the same cell size.

What is claimed is:

1. A semiconductor memory comprising:
   a plurality of cells formed on a semiconductor substrate, the cells having active regions extending substantially in a longitudinal direction, each cell having a node electrode, a contact hole for the node electrode, and a bit line contact region,
   word lines extending in a direction perpendicular to the longitudinal direction of the active regions,
   bit lines extending in a longitudinal direction,
   wherein the bit line contact regions of two adjacent cells which are connected to different yet adjacent bit lines are shifted with respect to the longitudinal direction by a distance which is one quarter of a length between two adjacent bit contact regions which are connected to a common bit line; and
   the node electrode is shaped as a polygon having at least five interior angles, at least one of the interior angles being an obtuse angle.

2. The semiconductor memory of claim 1, wherein the polygon has an area which is greater than $3.75 \mu m^2$.

3. The semiconductor memory of claim 1, wherein the polygon is a pentagon.

4. The semiconductor memory of claim 1, wherein the polygon is a hexagon.

5. The semiconductor memory of claim 1, wherein the polygon is a heptagon

6. The semiconductor memory of claim 1, wherein the polygon is a octagon.

7. The semiconductor memory of claim 1, further comprising a plate electrode formed in a position other than between adjacent bit line contact regions.

8. The semiconductor memory of claim 7, further comprising a plate electrode formed in a position other than in a diagonal direction between adjacent bit line contact regions.

9. A semiconductor memory according to claim 7, wherein the plate electrode is formed by magnetron etcher for 195 seconds at a RF power of 300 W, a pressure of 100 mTorr and a magnetic flux density of 75 Gauss in the mixed gas atmosphere of chlorine gas ($Cl_2$) of 54 SCCM, hydrogen bromide (HBr) of 66 SCCM and oxygen gas ($O_2$) of 2 SCCM.

* * * * *